United States Patent [19]
Nagase

[11] Patent Number: 5,373,475
[45] Date of Patent: Dec. 13, 1994

[54] SEMICONDUCTOR DEVICE IN WHICH THE NUMBER OF WORD LINES SELECTED SIMULTANEOUSLY IN A REFRESH MODE IS EXTERNALLY SELECTABLE AND METHOD OF MANUFACTURING THE SAME

[75] Inventor: Koichi Nagase, Hyogo, Japan

[73] Assignee: Mitsubishi Denki Kabushiki Kaisha, Tokyo, Japan

[21] Appl. No.: 924,878

[22] Filed: Aug. 6, 1992

[30] Foreign Application Priority Data

Aug. 13, 1991 [JP] Japan ................... 3-202882

[51] Int. Cl.$^5$ ............................................... G11C 7/00
[52] U.S. Cl. ............................ 365/222; 365/230.03
[58] Field of Search ........................ 365/222, 230.03

[56] References Cited

U.S. PATENT DOCUMENTS

| | | | |
|---|---|---|---|
| 4,486,860 | 12/1984 | Takamae et al. | 365/222 |
| 4,706,221 | 11/1987 | Satoh et al. | 365/222 |
| 4,819,207 | 4/1989 | Sakui et al. | 365/222 |
| 4,907,194 | 3/1990 | Dosaka et al. | 365/222 |
| 4,933,907 | 6/1990 | Kumanoya et al. | 365/222 |
| 4,934,826 | 6/1990 | Miyatake et al. | 365/222 |
| 4,943,960 | 7/1990 | Komatsu et al. | 365/222 |
| 4,961,167 | 10/1990 | Kumanoya et al. | 365/222 |
| 5,161,124 | 11/1992 | Love | 365/222 |

FOREIGN PATENT DOCUMENTS

0254057A2  1/1988  European Pat. Off. .
3311948A1  8/1984  Germany .

Primary Examiner—Eugene R. LaRoche
Assistant Examiner—Son Dinh
Attorney, Agent, or Firm—Lowe, Price, LeBlanc & Becker

[57] ABSTRACT

A refresh mode switching signal generating circuit generates a refresh mode switching signal of an H level or an L level depending on whether a particular bonding pad is wire-bonded to a power supply terminal of a package. In response to the refresh mode switching signal, the refresh mode switching circuit switches a cycle number in a refresh mode of a semiconductor memory device, so that the cycle number in a refresh mode can be changed according to requirements of users.

13 Claims, 8 Drawing Sheets

FIG. 4
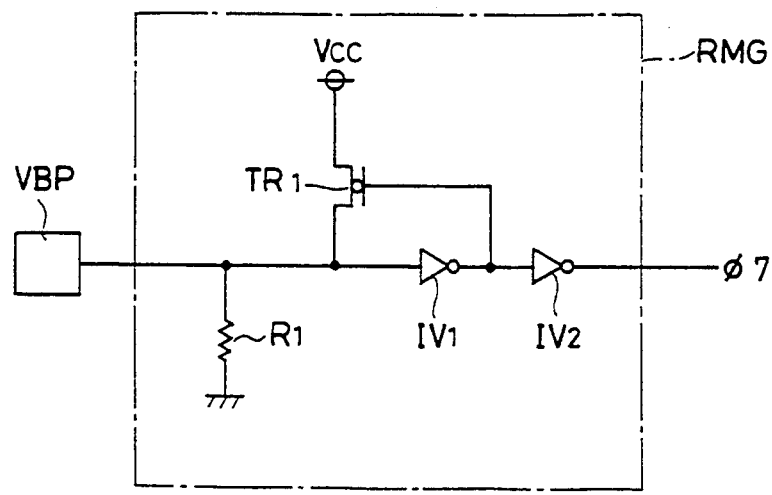
FIG. 5
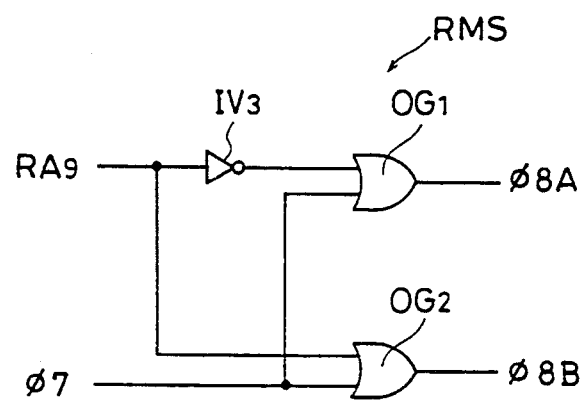
FIG. 6
| RA9 | ø7 | ø8A | ø8B | |
|---|---|---|---|---|
| 0 | 0 | 1 | 0 | } 1024 REFRESH |
| 1 | 0 | 0 | 1 | |
| 0 | 1 | 1 | 1 | } 512 REFRESH |
| 1 | 1 | 1 | 1 | |

SEMICONDUCTOR DEVICE IN WHICH THE NUMBER OF WORD LINES SELECTED SIMULTANEOUSLY IN A REFRESH MODE IS EXTERNALLY SELECTABLE AND METHOD OF MANUFACTURING THE SAME

BACKGROUND OF THE INVENTION

1. Field of the Invention

The present invention relates to a semiconductor memory device and, more particularly, to a semiconductor memory device in which memory cells are refreshed.

2. Description of the Background Art

With a recent rapid advance of semiconductor integrated technology, a dynamic RAM (hereinafter referred to as a DRAM) tends to have a larger capacity. The larger the capacity becomes, the more the number of word lines included in a DRAM increases.

Since a DRAM can not store information in each memory cell in a nonvolatile manner, it is necessary to refresh information stored in each memory cell periodically to prevent destruction of information. A cycle number necessary to refresh the whole memory cell array (hereinafter referred to as a refresh cycle number) is fixed separately according to a capacity of a DRAM. For example, a DRAM of 1M bit is fixed to have a refresh cycle number of 512 cycle/8 ms (hereinafter such a refresh operation is referred to as a 512 refresh). A DRAM of 4M bit is fixed to have a refresh cycle number of 1024 cycle/16.4 ms (hereinafter such a refresh operation is referred to as a 1024 refresh).

FIG. 11 is a schematic diagram for describing a refresh operation in a DRAM of 1M bit. Referring to the figure, a memory cell array MCA is divided into, for example, two blocks BK1 and BK2 in order to carry out a 512 refresh. First block BK1 and second block BK2 each include 512 word lines WL. A row decoder is divided into two parts corresponding to first block BK1 and second block BK2. Two row decoders RD each select one word line WL. Therefore, as a whole memory cell array MCA, two word lines WL are selected simultaneously. By selection of word lines WL, a plurality of memory cells connected thereto are refreshed simultaneously. A refresh operation of the whole memory cell array MCA is completed by repeating a selecting operation of a word line WL by each row decoder RD 512 times. That is, the 512 refresh operation can be carried out in a DRAM of 1M bit.

FIG. 12 is a schematic diagram for showing a refresh operation in a DRAM of 4M bit. Referring to the figure, a memory cell array MCA is divided into, for example, four blocks BK1-BK4 in order to implement a 1024 refresh. Each block includes 1024 word lines. A row decoder is divided into four to correspond to four blocks BK1-BK4 of memory cell array MCA. Each row decoder RD selects one word line WL in a refresh mode. Therefore, as a whole memory cell array MCA, four word lines WL are selected simultaneously. As in a DRAM of 1M bit, a plurality of memory cells connected to the selected word lines are refreshed simultaneously. A refresh operation of the whole memory cell array MCA is completed by repeating selection of word lines 1024 times. That is, a 1024 refresh operation can be carried out in a DRAM of 4M bit.

A demand for using a DRAM of a large capacity frequently arises among users who desire to improve a system using a DRAM. However, if a DRAM included in a system is replaced with one with a large capacity, a refresh cycle number of a DRAM changes, and a structure and/or a program of the system should be modified accordingly. Since such modification is extremely troublesome and costs time and money, users desire to use a DRAM having the same refresh cycle number as much as possible. In order to satisfy such a demand, it is proposed to combine a plurality of DRAMs of a small capacity to provide a large capacity. However, in such a method, a problem arises that an area required for DRAM increases and so does power consumption. Another problem also exists that it costs more to use a combination of a plurality of DRAMs of a small capacity than to use one DRAM of a large capacity.

One possible solution of the above problems offered by manufactures is to produce several kinds of products having different refresh cycle numbers for DRAMS of the same capacity. However, such a production in a small quantity with many varieties raises the cost of product, and therefore prevents reduction of cost which can be achieved by mass production. Even though a variety of products are produced in a master slice approach in which design modification is relatively easy, production efficiency is low and the cost increases compared to mass production of the same kind of product.

As described above, since a conventional DRAM has one fixed refresh cycle number for each capacity, it is difficult to change a DRAM which has been in use with a DRAM having different capacities.

SUMMARY OF THE INVENTION

Accordingly, an object of the present invention is to provide a semiconductor memory device capable of switching a refresh cycle number arbitrarily in a refresh mode.

A semiconductor memory device according to the present invention includes a plurality of word lines, a plurality of bit line pairs arranged across these word lines, a memory cell array including a plurality of memory cells arranged at each of crossings of the word lines and the bit line pairs, and refreshes stored information in each memory cell in a refresh mode. A semiconductor memory device according to the present invention further includes word line selecting means, bit line pair selecting means, refresh mode switching signal generating means and controlling means. Word line selecting means selects a word line in response to a row address signal. Bit line pair selecting means selects a bit line pair in response to a column address signal. Refresh mode switching signal generating means generates a refresh mode switching signal for switching types of refresh mode. Controlling means controls the number of word lines selected simultaneously in a refresh mode by word line selecting means in response to the refresh mode switching signal.

According to the present invention, the number of word lines selected simultaneously in a refresh mode is switched in response to external designation. That is, a refresh cycle number in a refresh mode is arbitrarily switched in response to external designation. As a result, one semiconductor memory device can be driven at different refresh cycle numbers.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram showing a more detailed structure of a refresh mode switching signal generating circuit RMG shown in FIG. 1.

FIG. 5 is a logic circuit diagram showing a more detailed structure of a refresh mode switching circuit RMS shown in FIG. 1.

FIG. 6 is a chart for describing an operation of the refresh mode switching circuit shown in FIG. 5.

DESCRIPTION OF THE PREFERRED EMBODIMENTS

Figure 1:
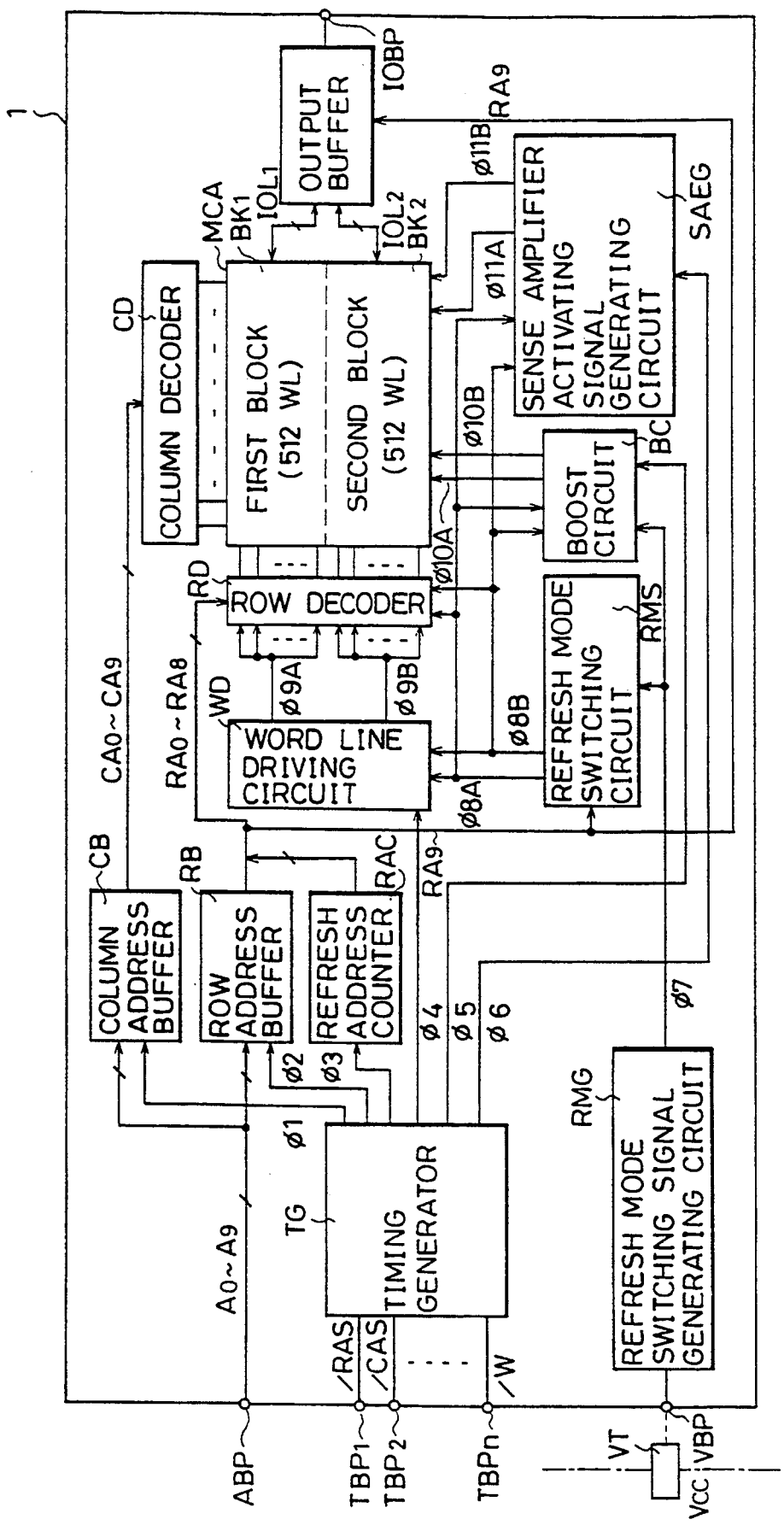
FIG. 1 is a block diagram showing a structure of one embodiment of the present invention.

FIG. 1 is a schematic block diagram showing a structure of one embodiment of the present invention. The embodiment of FIG. 1 shows, as one example, a semiconductor memory device having a storage capacity of 1M bit and capable of switching between a 1024 refresh and a 512 refresh in a refresh mode. A semiconductor chip 1 is accommodated in a package PAK. In the periphery of semiconductor chip 1, a bonding pad ABP to provide address signals A0–A9, bonding pads TBP1–TBPn to provide several kinds of timing signals (a row address strobe signal /RAS, a column address strobe signal /CAS, a write enable signal/W, etc.), a bonding pad VBP provided for switching between a 1024 refresh and a 512 refresh, and a bonding pad IOBP for input/output of data are provided. Bonding pad VBP is wire-bonded (connected) to a power supply terminal VT (to which power supply voltage Vcc is applied) when a semiconductor memory device mounted on semiconductor chip 1 performs a 1024 refresh, and bonding pad VBP is not connected to power supply terminal VT but opened when the semiconductor memory device performs the 512 refresh.

A timing generator TG generates internal timing signals $\phi1$–$\phi6$ in response to several kinds of timing signals provided from bonding pads BP1–BPn. Timing signal $\phi1$ is applied to a column address buffer CB. Timing signal $\phi2$ is applied to a row address buffer RB. A timing signal $\phi3$ is applied to a refresh address counter RAC. Timing signal $\phi4$ is applied to a word line driving circuit WD. A timing signal $\phi5$ is applied to a boost circuit BC. A timing signal $\phi6$ is applied to a sense amplifier activating signal generating circuit SAEG. Address signals A0–A9 provided from bonding pad ABP include column address signals and row address signals in a time divisional manner. Column address buffer CB latches column address signals CA0–CA9 among address signals A0–A9 in response to timing signal $\phi1$. Row address buffer RB latches row address signals RA0–RA9 among address signals A0–A9 in response to timing signal $\phi2$. Column address signals CA0–CA9 latched by column address buffer CB are applied to a column decoder CD. The most significant bit of signal RA9 among the row address signals latched by row address buffer RB is applied to a refresh mode switching circuit RMS and an output buffer IOB, and the rest of row address signals RA0–RA8 are applied to a row decoder RD.

Row decoder RD selects a word line in a memory cell array MCA in response to the applied row address signals RA0–RA8. A driving voltage applied to the selected word line is generated by a word line driving circuit WD. Column decoder CD selects a bit line pair in a memory cell array MCA in response to the applied column address signals CA0–CA9.

A refresh mode switching signal generating circuit RMG generates a refresh mode switching signal $\phi7$ corresponding to a state of bonding pad VBP. Refresh mode switching signal $\phi7$ is at a logic high level (an H level) when bonding pad VBP is wire-bonded to power supply terminal VT of package PAK, and at a logic low level (an L level) when the pad is opened. Refresh mode switching signal $\phi7$ is applied to refresh mode switching circuit RMS and boost circuit BC. Refresh mode switching circuit RMS generates switching control signals $\phi8A$ and $\phi8B$ in response to the most significant bit signal RA9 of a row address signal and refresh mode switching signal $\phi7$. Switching control signals $\phi8A$ and $\phi8B$ are applied to word line driving circuit WD, row decoder RD, boost circuit BC and sense amplifier activating signal generating circuit SAEG.

Word line driving circuit WD generates word line driving voltages $\phi9A$ and $\phi9B$ applied to the selected word lines in response to timing signal $\phi4$ and switching control signals $\phi8A$, $\phi8B$. These word line driving voltages $\phi9A$ and $\phi9B$ are applied to row decoders RD.

Boost circuit BC generates open/close controlling signals $\phi10A$ and $\phi10B$ in response to a timing signal $\phi5$, refresh mode switching signal $\phi7$, switching control signals $\phi8A$ and $\phi8B$. Memory cell array MCA is divided into two blocks BK1 and BK2 each including 512 word lines. Open/close controlling signal $\phi10A$ is applied to the gates of transfer gates TG3, TG4 (see FIG. 3) in first block BK1. Open/close controlling signal $\phi10B$ is applied to each gate of transfer gates TG3, TG4 included in second block BK2.

Sense amplifier activating signal generating circuit SAEG generates sense amplifier activating signals $\phi11A$ and $\phi11B$ in response to timing signal $\phi6$, switching control signals $\phi8A$ and $\phi8B$. Sense amplifier activating signal $\phi11A$ is applied to each sense amplifier SA (see FIG. 3) included in first block BK1 of memory cell array MCA. Sense amplifier activating signal $\phi11B$ is applied to each sense amplifier SA included in second block BK2.

Output buffer IOB is connected to first block BK1 through an input/output line pair IOL1 and to second block BK2 through an input/output line pair IOL2. Output buffer IOB is also connected to bonding pad IOBP. Output buffer IOB controls switching of an input/output line pair connected to bonding pad IOBP in response to the most significant bit signal RA9 of a row address signal. Refresh address counter RAC generates a refresh row address in an internal refresh mode in response to timing signal φ3.

Figure 2:
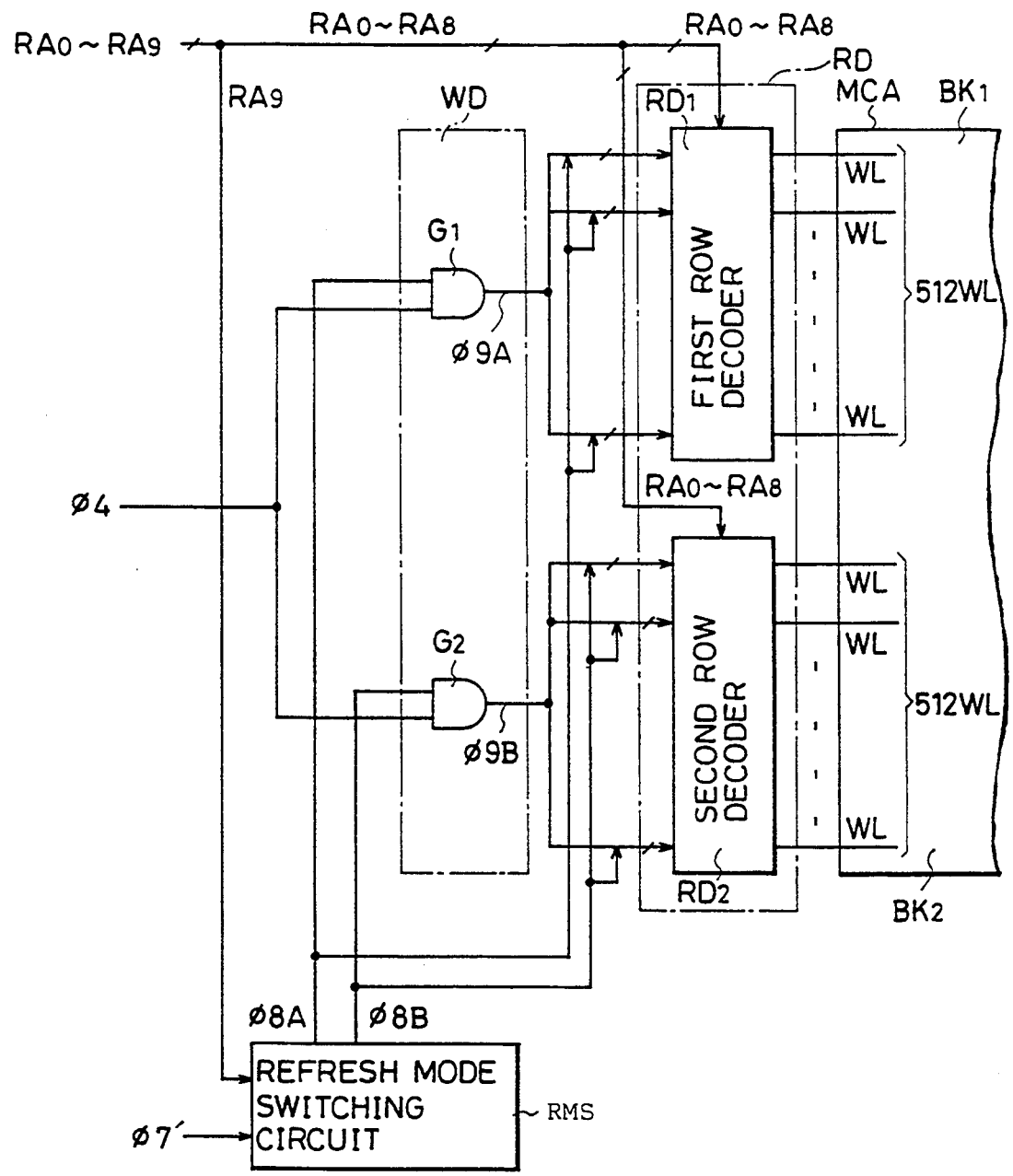
FIG. 2 is a diagram showing a more detailed structure of, in particular, the vicinity of a row decoder RD and a word line driving circuit WD of the embodiment shown in FIG. 1.

FIG. 2 is a diagram showing a more detailed structure of one portion, in particular, the vicinity of row decoder RD and word line driving circuit WD of the embodiment shown in FIG. 1. Referring to the figure, memory cell array MCA is divided into first and second blocks BK1 and BK2. First and second blocks BK1 and BK2 each include 512 word lines WL. Row decoder RD is also divided into two groups corresponding to the two blocks in memory cell array MCA. Row decoder RD includes a first row decoder RD1 and a second row decoder RD2. First and second row decoders RD1 and RD2 are each supplied with row address signals RA0–RA8.

Word line driving circuit WD includes two AND gates G1 and G2. Timing signal φ4 from timing generator TG (see FIG. 1) is applied to one of the input ends of each of AND gates G1 and G2. Switching control signal φ8A is applied to the other input terminal of AND gate G1 from refresh mode switching circuit RMS. Switching control signal φ8B is applied to the other input terminal of AND gate G2 from refresh mode switching circuit RMS. An output φ9A of AND gate G1 is applied to first row decoder RD1 as a word line driving voltage. An output φ9B of AND gate G2 is applied to second row decoder RD2 as a word line driving voltage. Switching control signal φ8A is applied to first row decoder RD1 from refresh mode switching circuit RMS, and switching control signal φ8B is applied to refresh mode switching circuit RMS to second row decoder RD2.

Figure 3:
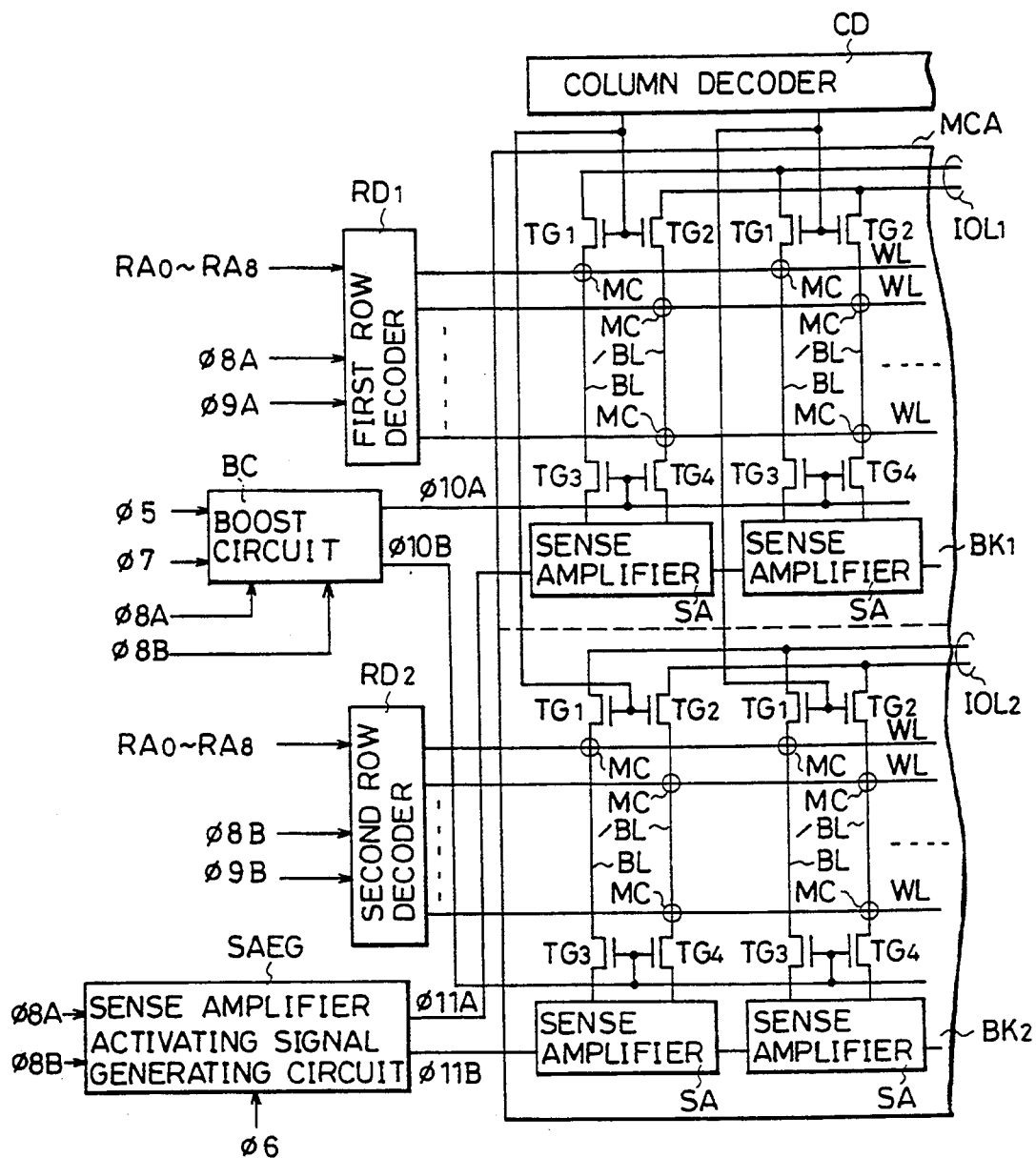
FIG. 3 is a diagram showing a more detailed structure of, in particular, a memory cell array portion of the embodiment shown in FIG. 1.

FIG. 3 is a diagram showing a more detailed structure of, in particular, the vicinity of memory cell array MCA of the embodiment shown in FIG. 1. Referring to the figure, each of blocks BK1 and BK2 of memory cell array MCA includes 512 word lines WL arranged in parallel, 1024 bit line pairs BL, /BL arranged across these word lines WL, and a plurality of memory cells MC arranged at crossing of the word lines and the bit line pairs. Each of blocks BK1 and BK2 further includes transfer gates TG1–TG4 arranged for each of a bit line pair BL, /BL and sense amplifiers SA. Respective transfer gates TG1 and TG2 of first block BK1 are interposed between input/output line pair IOL1 and corresponding bit line pair BL, /BL. Respective transfer gates TG1 and TG2 of second block BK2 are interposed between input/output line pair IOL2 and corresponding bit line pair BL, /BL. Respective transfer gates TG3 and TG4 of each of blocks BK1 and BK2 are interposed between a corresponding bit line pair BL, /BL and a corresponding sense amplifier SA.

First row decoder RD1 selects one word line among 512 word lines WL in first block BK1 of memory cell array MCA in response to row address signals RA0–RA8. Word line driving voltage φ9A is applied to the selected word line WL from word line driving circuit WD. A second row decoder RD2 selects one word line among 512 word lines WL in second block BK2 in response to row address signals RA0–RA8. Word line driving voltage φ9B is applied to the selected word line WL from word line driving circuit WD. Whether first and second row decoders RD1 and RD2 are enabled or disabled is controlled in response to switch control signals φ8A, φ8B from refresh mode switching circuit RMS. Each of transfer gates TG1 and TG2 is on/off controlled by column decoder CD. In response to column address signals CA0–CA9, column decoder CD turns on one pair of transfer gates TG1 and TG2 among 1024 pairs of transfer gates TG1 and TG2 in first block BK1, and turns on transfer gates TG1 and TG2 of the corresponding column in second block BK2. One bit line pair PL is selected in each of first and second blocks BK1 and BK2. Bit line pair BL, /BL selected in first block BK1 are connected to input/output line pair IOL1. Bit line pair BL, /BL selected in second block BK2 are connected to input/output line pair IOL2.

On/off of 1024 pairs of transfer gates TG3 and TG4 in first block BK1 is controlled in response to open/close controlling signal φ10A applied from boost circuit BC. 1024 pairs of transfer gates TG3 and TG4 in second block BK2 are on/off controlled in response to open/close controlling signal φ10B applied from boost circuit BC. Boost circuit BC sets both or either of open/close controlling signals φ10A, φ10B at an active level in response to refresh mode switching signals φ7, switching control signals φ8A and φ8B.

1024 pairs of sense amplifiers SA in first block BK1 are activated in response to sense amplifier activating signal φ11A from sense amplifier activating signal generating circuit SAEG. 1024 pairs of sense amplifiers SA in second block BK2 are activated in response to sense amplifier activating signal φ11B from sense amplifier activating signal generating circuit SAGE. Sense amplifier activating signal generating circuit SAEG sets both or either of sense amplifier activating signals φ11A, φ11B at an active level in response to switching control signals φ8A and φ8B.

FIG. 4 is a circuit diagram showing a more detailed structure of refresh mode switching signal generating circuit RMG shown in FIG. 1. Referring to the figure, refresh mode switching signal generating circuit RMG includes MOS transistor TRI of P channel type, a resistor R1, and inverters IV1 and IV2. Resistor R1 is interposed between bonding pad VBP and the ground. Transistor TRI has the source connected to a power supply (power supply voltage Vcc), the drain connected to bonding pad VBP and an input end of inverter IV1, and the gate connected to an output end of inverter IV1 and an input end of inverter IV2. A refresh mode switching signal φ7 is provided from an output end of inverter IV2.

An operation of refresh mode switching signal generating circuit RMG shown in FIG. 4 will be described. When bonding pad VBP is wire-bonded to power supply terminal VT of package PAK, power supply voltage Vcc is applied to bonding pad VBP. An output of inverter IV1 is at an L level (or logic 0). The output of inverter IV1 is inverted by inverter IV2 and refresh mode switching signal φ7 attains an H level (or logic 1). At this time, transistor TR1 is on, so that a potential of the input end of inverter IV1 is pulled up to power supply voltage Vcc through transistor TR1. When bonding pad VBP is opened, the input end of inverter IV1 is connected to ground through resistor R1. An output of inverter IV1 attains an H level (or logic 1). Accordingly, refresh mode switching signal φ7 of an L level (or logic 0) can be obtained from the output terminal of inverter IV2.

FIG. 5 is a logic circuit diagram showing a more detailed structure of refresh mode switching circuit RMS shown in FIG. 1. Referring to the figure, refresh mode switching circuit RMS includes inverter IV3, and OR gates OG1 and OG2. Refresh mode switching signal φ7 from refresh mode switching signal generating circuit RMG is applied to one of the input end of each of OR gates OG1 and OG2. The most significant bit signal RA9 of the row address signals is applied to the other input end of OR gate OG1 through inverter IV3 and directly to the other input end of OR gate OG2. Switching control signal $\phi8A$ is provided from the output end of OR gate OG1 and switching control signal $\phi8B$ is provided from the output end of OR gate OG2.

Refresh mode switching circuit RMS shown in FIG. 5 operates as shown in FIG. 6. When the logical level of refresh mode switching signal $\phi7$ is logical 0 (L level), the signal levels of both of switching control signals $\phi8A$, $\phi8B$ are logical one (an H level) according to the logic level of the most significant bit signal RA9. More specifically, when the logical level of the most significant bit signal RA9 is logical 0 (an L level), the level of switching control signal $\phi8A$ is logical one (an level) and the level of switching control signal $\phi8B$ is logical 0 (an L level). When the logical level of the most significant bit signal RA9 is logical one (an H level), the logical level of switching control signal $\phi8A$ is logical 0 (an L level) and a switching control signal $\phi8B$ is logical 1 (an H level). On the other hand, when the logical level of refresh mode switching signal $\phi7$ is logical 1 (an H level), both levels of switching control signals $\phi8A$ and $\phi8B$ are logical 1 (an H level) regardless of the logical level of the most significant bit signal RA9.

Figure 7:
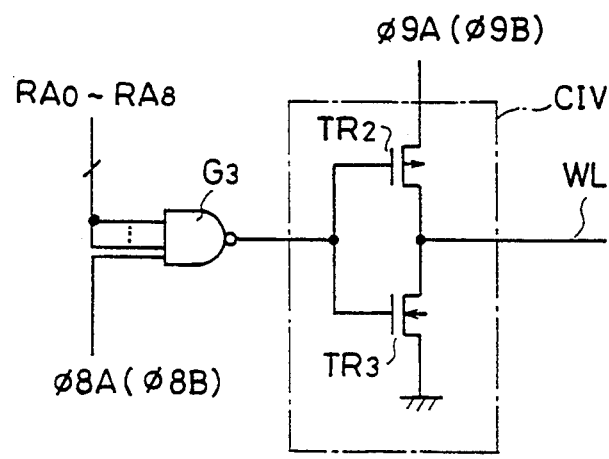
FIG. 7 is a diagram showing a circuit structure of one word line of a first row decoder RD1 shown in FIG. 2.

FIG. 7 is a circuit diagram showing a more detailed structure of first row decoder RD1 shown in FIG. 2. Fig. 7 shows a structure of one of the word lines in first row decoder RD1. First row decoder RD1 includes plural pairs of circuits shown in FIG. 7 whose number corresponds to the number of word lines WL. The circuit shown in FIG. 7 is constituted of a NAND gate G3, a P channel MOS transistor TR2, and an N channel MOS transistor TR3. Transistors TR2 and TR3 constitute a so-called CMOS inverter CIV. Row address signals RA0–RA8 and switching control signal $\phi8A$ are applied to NAND gate G3. Row address signals RA0–RA8 are applied to NAND gate G3 directly or after being inverted. Which bit of row address signals RA0–RA8 should be applied after being inverted is determined for each word line WL. An output of NAND gate G3 is applied to each of gates of transistors TR2 and TR3. Word line driving voltage $\phi9A$ is applied to the source of transistor TR2. The drain of transistor TR2 is connected to the drain of transistor TR3. The source of transistor TR3 is connected to the ground. The connecting point of the drain of transistor TR2 and the drain of transistor TR3 is connected to the corresponding word line WL.

Second row decoder RD2 also includes the same number of circuits shown in FIG. 7 as that of the word lines. However, switching control signal $\phi8B$ is applied to NAND gate G3 and word line driving voltage 9B is applied to the source of transistor TR2.

In FIG. 7, an output of NAND gate G3 attains an L level when a combination of logic levels of bits of row address signals RA0–RA8 corresponds to a predetermined one. Transistor TR2 is then turned on and transistor TR3 is turned off. As a result, word line driving voltage $\phi9A$ is applied to the corresponding word line WL. That is, the corresponding word line WL is at a selected state. When a combination of logic levels of row address signals RA0–RA8 is not a predetermined combination, the output of NAND gate G3 attains an H level and transistor TR2 is turned off, and transistor TR3 is turned on. The corresponding word line WL is then connected to ground through transistor TR3. At this time, the corresponding word line WL is at a nonselect state. Decoding operation of row address signals RA0–RA8 by NAND gate G3 is controlled according to switching control signal $\phi8A$. When the logic level of switching control signal $\phi8A$ is logical one, NAND gate G3 performs a normal decoding operation. When the level of switching control signal $\phi8A$ is logical 0, NAND gate G3 does not perform the decoding operation and its output is fixed at logical one.

Figure 8:
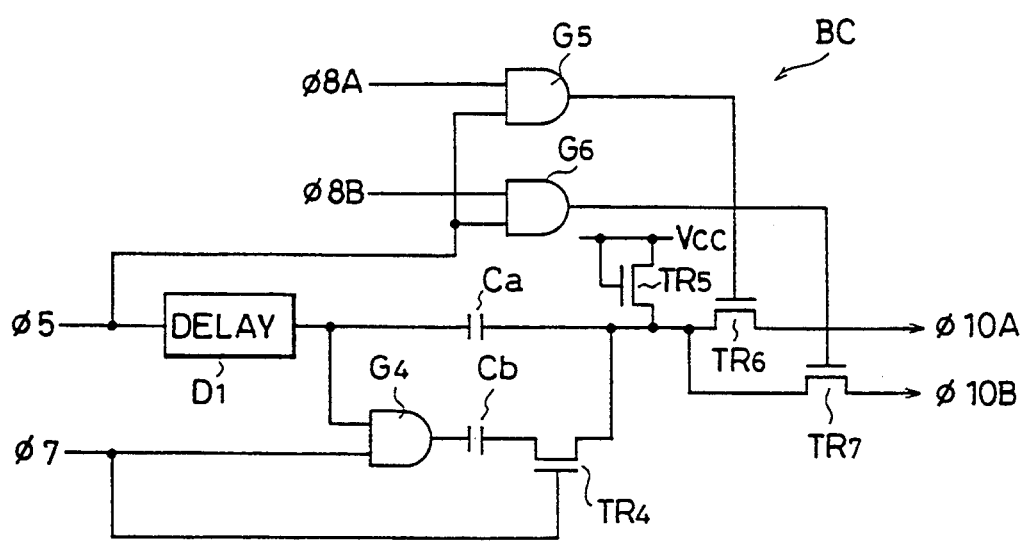
FIG. 8 is a circuit diagram showing a more detailed structure of a boost circuit BC shown in FIG. 1.

FIG. 8 is a circuit diagram showing a more detailed structure of boost circuit BC shown in FIG. 1. Referring to the figure, boost circuit BC includes AND gates G4–G6, delay circuit D1, capacitors Ca, Cb for boosting, and N channel MOS transistors TR4–TR7. Timing signal $\phi5$ from timing generator TG (see FIG. 1) is applied to one input end of each of AND gates G5 and G6, one input end of an AND gate G4 and one electrode of boosting capacitor Ca through delay circuit D1. Refresh mode switching signal $\phi7$ is applied to the other input terminal of AND gate G4 and the gate of transistor TR4. An output of AND gate G4 is applied to one electrode of boosting capacitor Cb. The other electrode of boosting capacitor Cb is connected to the other electrode of boosting capacitor Ca through transistor TR4. The other electrode of boosting capacitor Ca is connected to each of drains of transistors TR6 and TR7. An output of AND gate G5 is applied to the gate of transistor TR6. An output of AND gate G6 is applied to the gate of transistor TR7. The other electrode of boosting capacitor Ca is further connected to the source of transistor TR5. The drain and the gate of transistor TR4 are connected to a power supply (power supply voltage Vcc). Open/close controlling signal $\phi10A$ is provided from the source of transistor TR6, and open/close controlling signal $\phi10B$ is provided from the source of transistor TR7.

A refresh operation of the embodiment shown in FIG. 1 will be described.

The semiconductor memory device shown in FIG. 1 has an external refresh mode and an internal refresh mode as refresh modes. In the external refresh mode, a refresh is performed according to an address signal externally applied through bonding pad ABP. In an internal refresh mode, a refresh is performed according to a refresh address signal generated by an internal refresh address counter RAC independent of an external address signal. The external refresh mode includes a 1024 refresh mode and a 512 refresh mode. In the semiconductor memory device shown in FIG. 1, a 512 refresh mode and a 1024 refresh mode are switched, depending on whether or not bonding pad VBP is wire bonded to power supply terminal VT of package PAK. Each operation of the refresh modes will be described below.

(1) An Operation of a 1024 Refresh Mode

When a 1024 refresh mode is performed, bonding pad VBP is not wire bonded to power terminal VT of package PAK, but is opened. Refresh mode switching signal generating circuit RMG generates refresh mode switching signal $\phi7$ which is at logic 0 (an L level). Timing generator TG sets timing signal $\phi2$ in an active level in response to row address strobe signal /RAS applied from bonding pad TB1. Row address buffer RB latches row address signals RA0–RA9 in response to timing signal $\phi2$ attaining an active level.

When the logic level of the most significant bit signal RA9 of the row address signals latched by row address buffer RB is logical 0 (an L level), refresh mode switching circuit RMS outputs switching control signal $\phi$8A of logical 1 (an H level) and switching control signal $\phi$8B of logical 0 (an L level) as shown in FIG. 6. In response to these switching control signals $\phi$8A, $\phi$8B, first row decoder RD1 is enabled and second row decoder RD2 is disabled in row decoder RD. Sense amplifier activating circuit SAEG outputs sense amplifier activating signal $\phi$11A at an H level and sense amplifier activating signal $\phi$11B at an L level in response to the aforementioned switching control signals $\phi$8A, $\phi$8B. In response to sense amplifier activating signals $\phi$11A, $\phi$11B, each sense amplifier in first block BK1 is activated and each sense amplifier in second block BK2 is not activated in memory cell array MCA.

In word line driving circuit WD, when timing signal $\phi$4 attains an H level, AND gate G1 outputs word line driving voltage $\phi$9A of an H level. Since applied switching control signal $\phi$B is at an L level, an output $\phi$9B of AND gate G2 attains an L level. Therefore, a word line driving voltage at an H level is applied only to first row decoder RD1. First row decoder RD1 selects one word line among 512 word lines WL in first block BK1 in response to row address signals RA0—RA8, and applies word line driving voltage $\phi$9A from word line driving circuit WD to the selected word line.

In boost circuit BC shown in FIG. 8, when timing signal $\phi$5 from timing generator TG attains an H level, an output of AND gate G5 attains an H level. At this time, refresh mode switching signal $\phi$7 and switching control signal $\phi$8B are at an L level, so that outputs of AND gates G4 and G6 attain an L level. Transistor TR6 is turned on in response to the output of AND gate G5 attaining an H level. At this time, transistors TR4 and TR7 are held off. Timing signal $\phi$5 is applied to one electrode of boosting capacitor Ca after being delayed for a predetermined time by delay circuit D1, and boosts boosting capacitor Ca. Since a potential of the other electrode of boosting capacitor Ca has been pulled up almost to power supply voltage Vcc by transistor TR5, the potential of the other electrode of boosting capacitor Ca is boosted above the power supply voltage by timing signal $\phi$5. An output voltage of the other electrode of boosting capacitor Ca is transmitted to open/close controlling signal $\phi$10A through transistor TR6. Open/close controlling signal 10A then attains an H level. At this time, transistor TR7 is off, so that switching control signal $\phi$10B is brought into a floating state.

In response to open/close controlling signal $\phi$10A attaining an H level, transfer gates TG3 and TG4 in first block BK1 of memory cell array MCA are turned on. Since open/close controlling signal $\phi$10B is at a floating state, transfer gates TG3 and TG4 in second block BK2 are turned off. Therefore, each bit line pair BL, /BL and a corresponding sense amplifier SA are connected in first block BK1. Data is read onto each bit line pair BL, /BL in first block BK1 from a memory cell MC corresponding to the selected word line WL by first row decoder RD1. Each sense amplifier SA amplifies the data read onto each bit line pair BL, /BL and rewrites the data to each memory cell MC, so that memory cells MC in one row of first block BK1 are simultaneously refreshed. First row decoder RD1 sequentially updates a selected word lines WL in response to a change of a logic level of applied row address signals RA0–RA8. When all word lines are selected in first block BK1 by first row decoder RD1, the refresh operation of first block BK1 is completed.

When a refresh of first block BK1 is completed, the most significant bit signal RA9 of the row address signals represents logical one. Refresh mode switching circuit RMS then sets switching control signal $\phi$8A at logical 0 (an L level) and switching control signal $\phi$8B at logical one (an H level) as shown in FIG. 6. The semiconductor memory device shown in FIG. 1 then performs refresh of second block BK2. That is, first row decoder RD is disabled and second row decoder RD2 is enabled in row decoder RD. Word line driving circuit WD applies word line driving voltage $\phi$9A of an L level to first row decoder RD1 and word line driving voltage $\phi$9B of an H level to second row decoder RD2. Boost circuit BC turns off transfer gates TG3 and TG4 in first block BK1 and turns on transfer gates TG3 and TG4 in second block PK2. Sense amplifier activating signal generating circuit SAEG brings each sense amplifier SA in first block BK1 into an inactive state and activates each sense amplifier SA in second block BK2. Second row decoder RD2 sequentially selects each word line WL in second block BK2 in response to applied address signals RA0–RA8. Data read from memory cell MC belonging to the selected word line is rewritten into each memory cell MC after being amplified by the corresponding sense amplifier SA. Thus, refresh of stored information is performed. When all word lines WL are selected in second block BK2 by second row decoder RD2, refresh of second block BK2 is completed.

As described above, in a 1024 refresh mode, row decoder RD selects 1024 word lines WL in memory cell array MCA one by one. Thus, refresh of first block BK1 and second block BK2 in memory cell array MCA is performed sequentially.

In the 1024 refresh mode, a word line driving voltage is applied only to an enabled row decoder of first and second row decoders RD1 and RD2, so that power consumption can be reduced. The reason will be described with reference to FIGS. 9 and 10.

Figure 9:
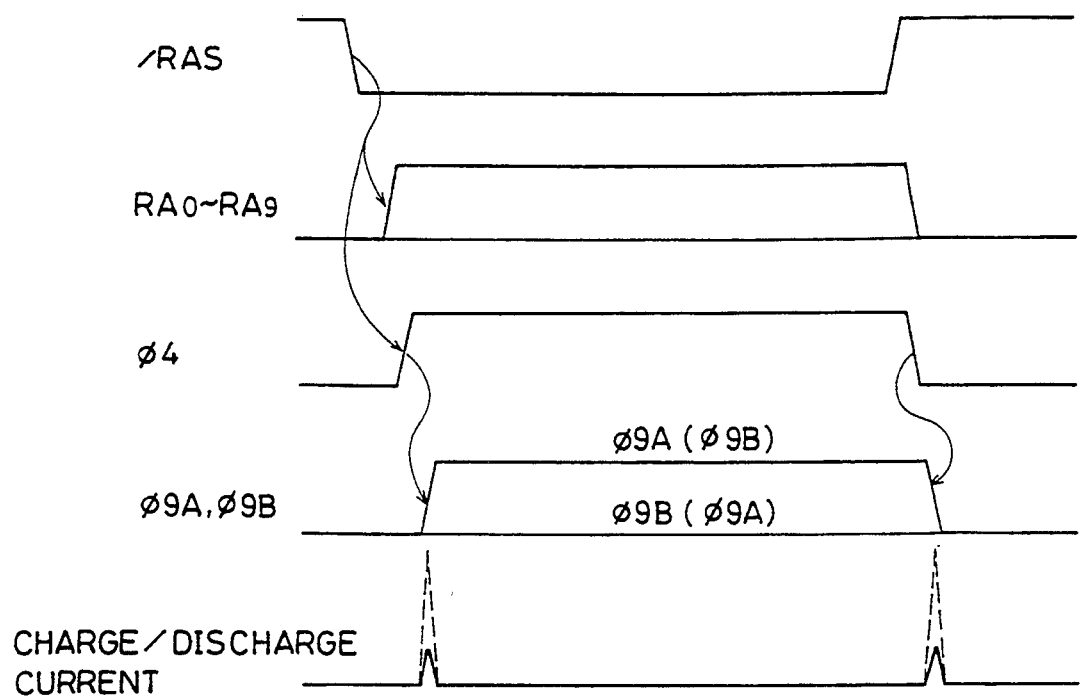
FIG. 9 is a waveform chart for describing an operation of word line driving circuit WD shown in FIG. 1.
Figure 10:
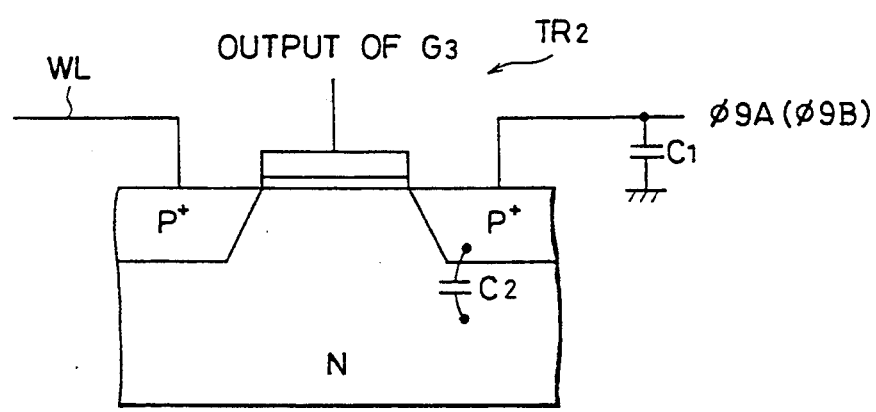
FIG. 10 is a diagram showing a sectional structure of transistor TR2 shown in FIG. 7.
Figure 11:
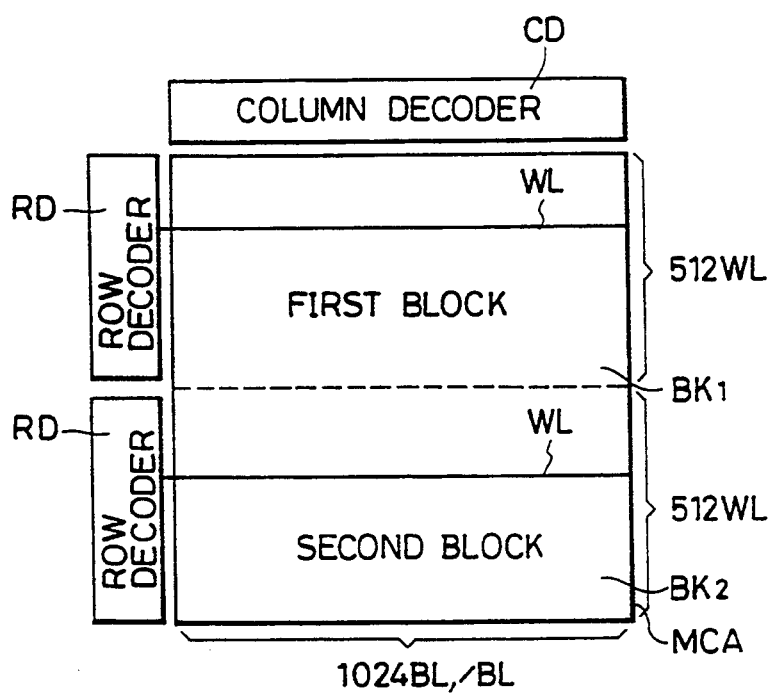
FIG. 11 is a schematic diagram for showing a refresh operation in a conventional DRAM of 1M bit.
Figure 12:
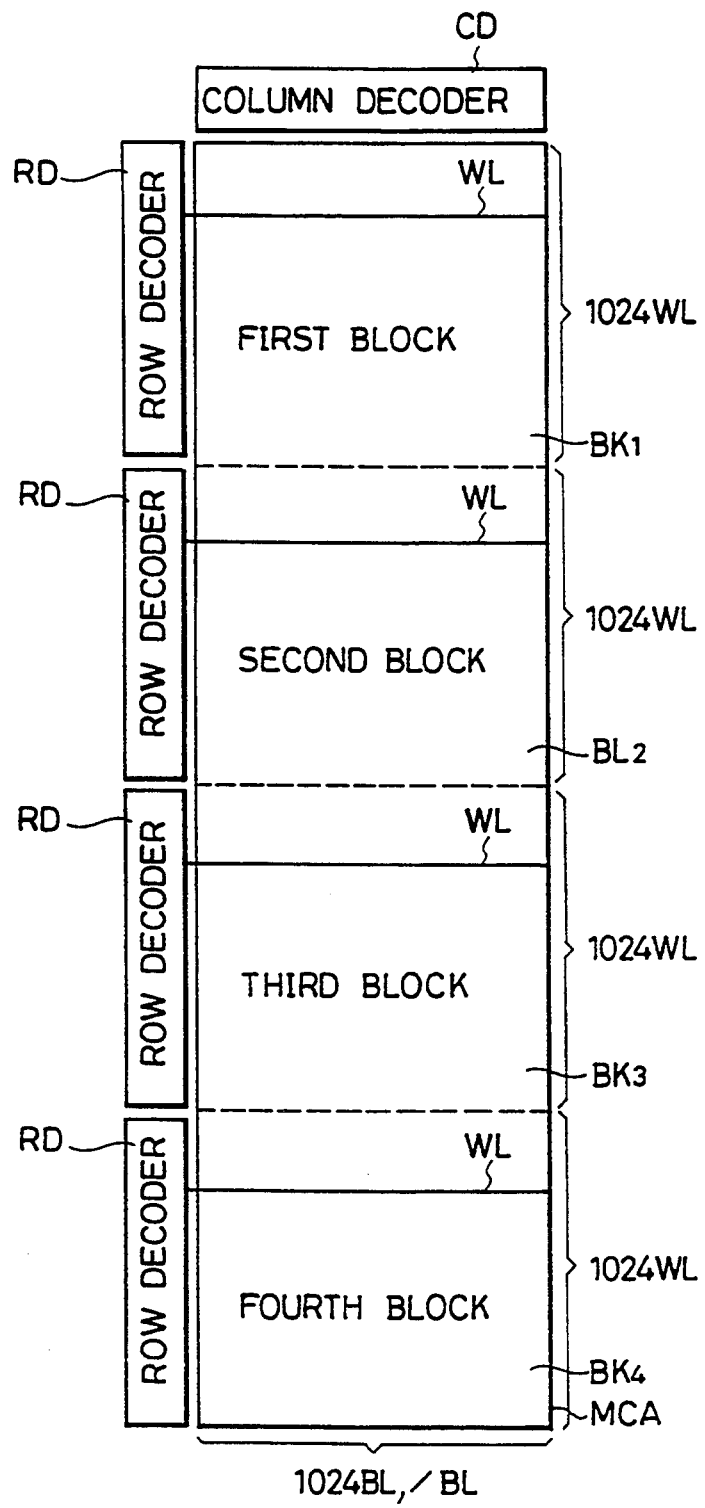
FIG. 12 is a schematic diagram for showing a refresh operation in a conventional DRAM of 4M bit.

FIG. 10 is a sectional view of transistor TR2 shown in FIG. 7. An interconnection capacitance C1 is connected to a P type impurity region which is the source of transistor TR2, and a junction capacitance C2 exists between the P type impurity region and an N type semiconductor substrate. Row decoder RD includes interconnection capacitance C1 and junction capacitance C2 for each of 1024 word lines WL. If 1024 pairs of interconnection capacitances C1 and junction capacitances C2 should be driven simultaneously when word line driving circuit WD drives the selected word line, charge/discharge current by word line driving circuit WD becomes extremely large as shown by dotted lines in FIG. 9. However, in the semiconductor memory device of FIG. 1, first row decoder RD1 and second row decoder RD2 are enabled sequentially in a 1024 refresh mode, so that it is not necessary to apply the word line driving voltage to both of first and second row decoders RD1 and RD2 simultaneously, but the word line driving voltage should be applied to the enabled row decoder. Thus, word line driving circuit WD applies the word line driving voltage selectively to first and second row decoders RD1 and RD2 in response to switching control signals $\phi$8A, $\phi$8B. As a result, the numbers of interconnection capacitances and junction capacitances to be driven are reduced to a half and the charge/discharge current of the word line driving circuit WD decreases as shown in FIG. 9 from the dotted lines to the solid lines.

(2) An Operation of a 512 Refresh Mode

In order to implement a 512 refresh mode, bonding pad VBP is wire bonded to power supply terminal VT of package PAK. Power supply voltage Vcc is applied to refresh mode switching signal generating circuit RMG. Refresh mode switching signal generating circuit RMG outputs a refresh mode switching signal $\phi 7$ of an H level. Row address buffer RB latches row address signals RA0–RA9 in response to a fall of row address strobe signal /RAS. Refresh mode switching circuit RMS sets both of switching control signals $\phi 8A$ and $\phi 8B$ at logical 1 (an H level) regardless of the logic level of the most significant bit signal RA9 of the row address signals applied from row address buffer RB as shown in FIG. 6, since refresh mode switching signal $\phi 7$ is at an H level. Switching control signals $\phi 8A$ and $\phi 8B$ are both at an H level, so that both first row decoder RD1 and second row decoder RD2 are enabled. Word line driving circuit WD raises both levels of word line driving voltages $\phi 9A$ and $\phi 9B$ to an H level. Sense amplifier activating signal generating circuit SAEG raises both levels of sense amplifier activating signals $\phi 11A$, $\phi 11B$ to an H level. Therefore, all sense amplifiers SA are activated in first and second blocks BK1 and BK2.

Boost circuit BC performs the following operation in response to both switching control signals $\phi 8A$ and $\phi 8B$ attaining an H level. When timing signal $\phi 5$ attains an H level, both outputs of AND gates G5 and G6 shown in FIG. 8 attain an H level. Transistor TR6 and TR7 are then turned on. Since refresh mode switching signal $\phi 7$ is at an H level, transistor TR4 is turned on. Timing signal $\phi 5$ boosts boosting capacitor Ca after delay time defined by delay circuit D1 and also boosts boosting capacitor Cb through AND gate G4. Therefore, in the 512 refresh mode, boosting capacitance is double that in the 1024 refresh mode. Output voltages of boosting capacitors Ca and Cb are integrated into one through transistor TR4 and then transmitted to open/close controlling signals $\phi 10A$ and $\phi 10B$ through transistors TR6 and TR7. Open/close controlling signals $\phi 10A$ and $\phi 10B$ both attain an H level. As a result, all transfer gates TG3 and TG4 in first and second blocks BK1 and BK2 are turned on.

In the 512 refresh mode, both first and second row decoders RD1 and RD2 are enabled, so that first and second row decoders RD1 and RD2 each select one word line in response to row address signals RA0–RA8. That is, one word line WL is selected in first block BK1 and one word line WL is selected in second block BK. Therefore, in both first and second blocks BK1 and BK2, data of one row of memory cells MC is read onto each bit line pair BL, /BL. At this time, since all sense amplifiers SA in each of blocks BK1 and BK2 are activated, data read onto each bit line pair BL, /BL are refreshed through amplification by the corresponding sense amplifier SA. When first and second row decoders RD1 and RD2 each repeat selection of a word line 512 times, refresh of the whole memory cell array MCA is completed.

As described above, in the 512 refresh mode, first and second blocks BK1 and BK2 are simultaneously refreshed. As a result, the refresh cycle number is half the number of the 1024 refresh mode, that is to say, 512. Therefore a 512 refresh is achieved.

Boost circuit BC generates an open/close controlling signal by using only boosting capacitor Ca in the 1024 refresh mode, but in the 512 refresh mode, it generates the signal by using boosting capacitors Ca and Cb. The reasons for switching a capacitance value of a boosting capacitor in the 1024 refresh mode and in the 512 refresh mode are as follows. In the 1024 refresh mode, transfer gates TG3 and TG4 in either of first and second blocks BK1, BK2 are driven. However, in the 512 refresh mode, transfer gates TG3 and TG4 in both first and second blocks BK1 and BK2 should be driven. Therefore the number of pairs of transfer gates TG3 and TG4 to be driven in the 512 refresh mode is double the number of pairs of transfer gates TG3 and TG4 to be driven in the 1024 refresh mode. Since each of transfer gates TG3 and TG4 naturally has interconnection capacitance and floating capacitance, a capability of driving of an open/close controlling signal in the 512 refresh mode should be almost twice that of an open/close controlling signal of the 1024 refresh mode. If the optimal value in the 1024 refresh mode is chosen as a capacitance value of boosting capacitance in boost circuit BC in the 512 refresh mode, the capability of driving of an open/close controlling signal is so small that a circuit operation is hindered. Conversely, if the optimal value in the 512 refresh mode is chosen as a capacitance value of boosting capacitance in boost circuit BC in the 1024 refresh mode, a capacitance value of boosting capacitance is so large that power is wasted. Therefore, in the embodiment shown in FIG. 1, the optimal value of a capacitance value of boosting capacitance is constantly selected to reduce power consumption by switching a capacitance value of boosting capacitance in boost circuit BC in the 1024 refresh mode and in 512 refresh mode.

(3) Operation in an Internal Refresh Mode

As described above, in an internal refresh mode, refresh is performed by generating an address signal within a semiconductor memory device independent of an external address signal. The internal refresh mode is activated, for example, when row address strobe signal RAS and column address strobe signal /CAS are input at an abnormal timing. It is activated, for example, in response to column address strobe signal /CAS falling before row address strobe signal /RAS falls (such a state is usually called RAS before CAS). When timing generator TG detects the RAS before CAS, one pulse is provided to timing signal $\phi 3$. Refresh address counter RAC is incremented in response to the pulse of timing signal $\phi 3$. Refresh address counter RAC is a binary counter of 10 bits and its output is applied to each circuit of the semiconductor memory device in FIG. 1 as pseudo row address signals RA0–RA9. The semiconductor memory device shown in FIG. 1 operates in response to the row address signals provided from refresh address counter RAC. At this time, if the semiconductor memory device shown in FIG. 1 is switched to the 1024 refresh mode, one word line is selected in memory cell array MCA and stored information in each memory cell MC belonging to the selected word line is refreshed. Conversely, if the semiconductor memory device of FIG. 1 is switched to the 512 refresh mode, one word line WL is selected in each of first and second blocks BK1 and BK2 and stored information of each memory cell MC belonging to these word lines WL is refreshed. Every time timing generator TG detects the RAS before CAS, a counter value of refresh address counter RAC is incremented, so that pseudo-row address signal provided from refresh address counter RAC is updated.

Operations in the refresh modes of the embodiment shown in FIG. 1 have been described. Write and read operation of data is carried out in the almost same manner as in a general DRAM. However, output buffer IOB selectively connects bonding pad IOBP to either of input/output line pair IOL1, IOL2 in response to the logic level of the most significant bit signal RA9 of row address signals. As a result, whether the semiconductor memory device shown in FIG. 1 is switched to the 1024 refresh mode or to the 512 refresh mode, read data and written data can be output/input without any hindrance.

Although a semiconductor memory device of 1M bit has been shown as one embodiment of the present invention, the invention is also applicable to a semiconductor memory device having other storage capacities.

Although the above described embodiment is structured to perform switching between the 1024 refresh mode and the 512 refresh mode, the present invention is not limited thereto and may be structured to perform switching to other refresh modes.

In the embodiment shown in FIG. 1, switching of refresh modes is performed according to whether or not bonding pad VBP is wire bonded to power supply terminal VT of package PAK; however a refresh mode within the semiconductor memory device may be switched by switching voltages externally applied to a particular terminal of package PAK to which bonding pad VBP is constantly wire-bonded.

As described above, according to the present invention, a cycle number of a refresh mode of the semiconductor memory device can be switched arbitrarily, so that compatibility with an existing system can be enhanced. Manufactures do not have to prepare several kinds of products of the same capacity and therefore reduction of production cost can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device refreshing stored information of each memory cell in a refresh mode and including a plurality of word lines, a plurality of bit line pairs arranged across these word lines, a memory cell array including a plurality of memory cells arranged at each of crossing of said word lines and said bit line pairs, said memory cell array having at least a first block and a second block, comprising:
   word line selecting means for selecting one of said word lines in response to row address signals;
   bit line pair selecting means for selecting one of said bit line pairs in response to column address signals;
   refresh mode switching signal generating means for generating a refresh mode switching signal to switch types of refresh mode in response to a voltage applied to a particular bonding pad, said voltage applied to said particular bonding pad being switched depending on whether said bonding pad is wire-bonded or not to a particular terminal of a package accomodating said semiconductor memory device to designate said memory cell array as one of
   i) a single block array comprised of said at least first and second blocks, and
   ii) divided into at least two blocks comprised of said at least first block and second blocks; and
   controlling means for controlling the number of word lines selected simultaneously by said word line selecting means in a refresh mode in response to said refresh mode switching signal.

2. The semiconductor memory device according to claim 1, wherein
   said word line selecting means includes a row decoder decoding the row address signals,
   said row decoder being divided into a plurality of groups whose number corresponds to a predetermined number of word lines; and wherein
   said controlling means controls enabling/disabling of each group of said row decoder in response to said refresh mode switching signal.

3. The semiconductor memory device according to claim 2, wherein
   said row decoder is divided into two groups; and
   said controlling means controls switching between a first refresh mode in which said row decoder as a whole selects the word lines one by one and a second refresh mode in which said two groups of the row decoder each select the word lines one by one in response to said refresh mode switching signal.

4. The semiconductor memory device according to claim 3, wherein
   said controlling means selectively enables said two groups of the row decoder in response to a logic level of the most significant bit of the row address signals, when said refresh mode switching signal designates said first refresh mode; and
   said controlling means simultaneously enables said two groups of the row decoder, when said refresh mode switching signal designates said second refresh mode.

5. The semiconductor memory device according to claim 2, further comprising:
   word line driving voltage generating means for generating a driving voltage for a word line selected by said row decoder, wherein
   said controlling means determines which group of said row decoder should be supplied with the word line driving voltage by said word line driving voltage generating means (WD) in response to said refresh mode switching signal.

6. The semiconductor memory device according to claim 5, wherein
   said row decoder is divided into two groups; and
   said controlling means performs switching control between a first refresh mode in which said row decoder as a whole selects word lines one by one and a second refresh mode in which said two groups of the row decoder each select word lines one by one in response to said refresh mode switching signal.

7. The semiconductor memory device according to claim 6, wherein
   said controlling means selectively enables said two groups of the row decoder and controls said word line driving voltage generating means such that a word line driving voltage is generated to the enabled group of the row decoder in accordance with a logic level of the most significant bit of said row address signals when said refresh mode switching signal designates said first refresh mode; and said controlling means simultaneously enables said two groups of the row decoder and controls said word line driving voltage generating means such that word line driving voltages are generated simultaneously to both of two groups of the row decoder when said refresh mode switching signal designates said second refresh mode.

8. The semiconductor memory device according to claim 1, wherein a power supply voltage or Vss is applied to said particular terminal of the package.

9. The semiconductor memory device according to claim 2, wherein said memory cell array is divided into a plurality of groups corresponding to each of the groups of said row decoder; and said each group of the memory cell array further comprises a plurality of sense amplifiers provided for each of said bit line pairs, and a plurality of transfer gates interposed between each of said bit line pairs and each of said sense amplifiers for electrically connecting and disconnecting each of said bit lines and each of said sense amplifiers.

10. The semiconductor memory device according to claim 8, further comprising boosting means including boosting capacitances for generating a voltage for turning on each of said transfer gates by using these boosting capacitances; and sense amplifier activating means for activating each of said sense amplifiers.

11. The semiconductor memory device according to claim 10, wherein said boosting means includes means for providing the generated voltage only to each of said transfer gates included in said group of the memory cell array corresponding to said group of said row decoder enabled by said controlling means.

12. The semiconductor memory device according to claim 11, wherein said boosting means further includes means for switching a capacitance value of said boosting capacitance in response to said refresh mode switching signal.

13. The semiconductor memory device according to claim 12, wherein said sense amplifier activating means activates only each of said sense amplifiers included in said group of memory cell array corresponding to said group of row decoder enabled by said controlling means.

* * * * *